US012772425B2

(12) United States Patent
Böhm et al.

(10) Patent No.: US 12,772,425 B2
(45) Date of Patent: Oct. 20, 2026

(54) POWER MODULE FOR A CONVERTER WITH IMPROVED FIELD SHIELDING OF SIGNAL PINS

(71) Applicant: ZF Friedrichshafen AG, Friedrichshafen (DE)

(72) Inventors: Kevin Böhm, Friedrichshafen (DE); Martin Mader, Biberach (DE); Ruben Bärenweiler, Markdorf (DE); Ivonne Trenz, Friedrichshafen (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 366 days.

(21) Appl. No.: 18/526,793

(22) Filed: Dec. 1, 2023

(65) Prior Publication Data

US 2024/0188263 A1 Jun. 6, 2024

(30) Foreign Application Priority Data

Dec. 2, 2022 (DE) ......................... 102022213011.1

(51) Int. Cl.
*H05K 7/14* (2006.01)
*B60L 15/00* (2006.01)
(Continued)

(52) U.S. Cl.
CPC .......... *H05K 9/0026* (2013.01); *B60L 15/007* (2013.01); *H05K 1/0256* (2013.01); *H05K 7/14322* (2022.08); *H05K 1/0237* (2013.01)

(58) Field of Classification Search
CPC ...... H02M 1/08; H02M 1/327; H02M 1/0054; H02M 1/007; H02M 1/0009; H02M 1/088; H02M 1/36; H02M 1/32; H02M 1/4225; H02M 1/44; H02M 1/10; H02M 7/003; H02M 7/5387; H02M 7/5395; H02M 7/53871; H02M 7/44; H02M 7/537;
(Continued)

(56) References Cited

U.S. PATENT DOCUMENTS

2010/0321915 A1 12/2010 Wendler et al.
2013/0294040 A1* 11/2013 Fukumasu ............. H02K 11/33 361/752

FOREIGN PATENT DOCUMENTS

DE 10 2004 025 609 A1 12/2005
DE 10 2010 014 940 A1 10/2011
DE 10 2016 206 233 A1 10/2017

OTHER PUBLICATIONS

Office Action dated Jun. 29, 2023 for German Patent Application No. 10 2022 213 011.1 (8 pp.), note: pp. 1 and 2 are English language Explanations to Section C. Result of Determination Document.

* cited by examiner

*Primary Examiner* — Bryan R Perez
(74) *Attorney, Agent, or Firm* — Crowell & Moring LLP

(57) ABSTRACT

A power module for a converter for use in an at least partly electrified vehicle has at least one power switch which can be switched for converting an input current into an output current, a plurality of power terminals which are electrically connected to current electrodes of the power switch and are designed to feed the input current or to withdraw the output current, a signal pin which is designed to impress a control signal generated by a control device on a control electrode of the power switch, and a shielding jacket which is potentially isolated from the signal pin and surrounds at least sections of the signal pin.

20 Claims, 3 Drawing Sheets

(51) Int. Cl.
*H05K 1/02* (2006.01)
*H05K 9/00* (2006.01)

(58) Field of Classification Search
CPC .. H02M 7/217; H02M 7/487; H02M 7/53875; H02M 7/797
See application file for complete search history.

POWER MODULE FOR A CONVERTER WITH IMPROVED FIELD SHIELDING OF SIGNAL PINS

CROSS-REFERENCE TO RELATED APPLICATION

This application claims priority to German Application No. DE 10 2022 213 011.1, filed on Dec. 2, 2022, the entirety of which is hereby fully incorporated by reference herein.

FIELD

The present disclosure relates to a power module for a converter for use in an electrified vehicle, i.e. an electric vehicle or a hybrid vehicle. In addition, the present disclosure relates to an electric axle drive having such a power module and a vehicle having such an electric axle drive.

BACKGROUND AND SUMMARY

Purely electric vehicles and hybrid vehicles which are driven exclusively by or with the assistance of one or more electric machines as drive assemblies are known from the prior art. Such electrified vehicles generally use a rechargeable vehicle drive battery which provides a DC voltage by which the electric machines are energized. For this purpose, the DC voltage is converted into an AC voltage by an inverter (DC/AC converter) in order to energize the electric machines in each case with a polyphase alternating current.

The core component part of such converters is formed by power electronics which have a multiplicity of power switches. These power switches are interconnected with one another in such a way as to provide a half-bridge arrangement which comprises one or more half-bridges. Each half-bridge comprises a high-side device and a low-side device which each have one or more power switches connected in parallel. Each power switch comprises a positive-pole current electrode (for example source electrode), a negative-pole current electrode (for example drain electrode) and a control electrode (for example gate electrode).

For the purpose of voltage conversion, the power switches are switched in a targeted manner. For switching a power switch, control signals are impressed on the control electrode of the power switch. The control signals are carried by a drive path which connects a control device to the control electrode in terms of signal technology. Signal pins which are each electrically connected on one side to a control electrode and on the other side to a printed circuit board which is populated with the component parts of the control device are used for this purpose.

At the same time, in each half-bridge a plurality of load paths each carry a load current which flows through one of the power switches, for example a source-drain current. The load currents generate, however, electromagnetic interference coupled into the signal pins. This comes about as a result of the fact that the magnetic lines of force which are induced by the load currents run perpendicular to the orientation of the signal pins and therefore to the drive path and therefore couple into the magnetic fluxes of the control current (gate current) which encircle the respective signal pin likewise perpendicular to the drive path. Depending on the coupling factor, a positive or negative voltage is induced in the signal pin which results in parasitic effects such as parasitic turn-on (PTO) or the safety operating area (SOA) being exceeded.

It is an object of the present disclosure to provide a power module for a converter in which the above-described coupling between the load path and the drive path is reduced.

This object is achieved by the power module, the converter, the electric axle drive and the vehicle as disclosed herein. Advantageous configurations and developments can also be gleaned from the present disclosure.

The present disclosure relates to a power module for a converter for operating an electric axle drive in an at least partly electrified vehicle such as an electric vehicle and/or a hybrid vehicle. The converter is preferably an inverter. In this case, the input current is a direct current provided by a DC voltage source, for example a rechargeable vehicle drive battery, wherein the output current is an alternating current having a plurality of phase currents. Alternatively, the converter is in the form of an AC/DC converter (rectifier) in order to recharge the vehicle drive battery, for example. For this purpose, an AC input voltage which is provided by an AC voltage supply (for example charging station) is converted, via the rectifier, into a DC output voltage which can then be supplied to the vehicle drive battery. Further alternatively, the converter is used as a DC/DC converter in order to adapt a DC input voltage to the DC operating voltage (rated voltage) of the vehicle drive battery, for example to step it up from 400V to 800V.

The power module comprises at least one power switch, preferably a plurality of power switches, for feeding the input current and for generating the output current on the basis of the fed input current by switching of the power switches. In the case of a polyphase inverter, the entire power electronics comprise a plurality of (for example three) phases which each have a half-bridge. Each phase or half-bridge serves to convert the fed direct current into a phase current by switching of the associated power switches, wherein the plurality of phase currents generated in this way are phase-shifted with respect to one another and are each passed into a winding of the electric machine in order to energize the electric axle drive. The half-bridges each have a high side having a relatively high electrical potential and a low side having a relatively low electrical potential. In the case of a polyphase rectifier, the entire power electronics likewise comprise a plurality of (for example three) phases, wherein the power switches are switched in such a way as to eliminate the phase shifts between the phase currents of the fed alternating current, which results in a direct current at the output.

Various configurations of the power module are conceivable. For example, the power module can be in the form of a so-called half-bridge module which has a module high side and a module low side each having a single power switch or a plurality of power switches connected in parallel. In this case, each phase of the entire converter can comprise a single half-bridge module or a plurality of half-bridge modules connected in parallel. In the former case, the high side of the phase is formed by the module high side and the low side of the phase is formed by the module low side of the single half-bridge module. In the latter case, the high side of the phase is formed by a parallel circuit of the module high sides of the half-bridge modules connected in parallel, wherein the low side of the phase is formed by a parallel circuit of the module low sides of the half-bridge modules connected in parallel. Alternatively, the power module can comprise only one module high side or one module low side. The case in which the power module has a single power switch occurs when the module high side or the module low side comprises only one single power switch. Further alternatively, the power module can relate to the entirety of the half-bridge modules of one phase connected in parallel or to the entirety of the module high sides or module low sides of one phase connected in parallel.

The power switches are preferably transistors, such as MOSFETs and/or IGBTs. The semiconductor material on which the power switches are based is preferably silicon or a so-called wide bandgap semiconductor (WBC), for example silicon carbide, gallium nitride or gallium oxide. The power switches are in addition preferably on a circuit carrier, for example a printed circuit board (PCB), or a multilayered ceramic substrate such as direct bonded copper (DBC), direct plated copper (DPC) or active metal bonding (AMB). Preferably, the power switches are arranged on an at least partially metallic first layer of the circuit carrier, wherein an at least partially metallic second layer of the circuit carrier is connected to a cooler. Preferably, a layer of insulation is arranged between the first layer and the second layer.

The power switches each comprise a positive-pole or controlled current electrode (for example drain electrode), a negative-pole current electrode or current electrode connected to ground potential (for example source electrode) and a control electrode (for example gate electrode). The positive-pole current electrode and the negative-pole current electrode form, together with the semiconductor structure located therebetween, a load path of the respective power switch through which the load current flows in an open (conducting) state of the power switch. The ground potential is preferably provided by a metallic layer of the circuit carrier on which the power switches are arranged. In order to feed the input current (load current) into the power electronics or in order to withdraw the output current from the power electronics, the power module comprises a plurality of power terminals which are electrically connected to the current electrodes of the respective power switch. The power terminals are connected to busbars in order to enable current to be carried with further component parts of the converter, for example a DC-link capacitor in the case of an inverter, or an external unit such as the windings of the electric machine to be energized.

In addition, each control electrode has at least one assigned signal pin, to which the control electrode is electrically conductively connected and by which a plurality of control signals generated by a control device (for example gate driver) can be impressed on the control electrode of the respective power switch. Therefore, the control electrode forms, together with the associated signal pin (or the associated signal pins), a drive path of the power switch through which the control signals are transmitted. The control device is fitted, for example, on a printed circuit board to which at least one signal pin is connected, for example by being pressed in. The at least one signal pin is preferably in the form of a coaxial signal pin.

According to the present disclosure, the power module has a shielding jacket which is potentially isolated from the signal pin and surrounds at least sections of the signal pin. The shielding jacket is used to shield the signal pin located therein from electromagnetic interference which arises as a result of the load current of the associated power switch. The shielding jacket can preferably be produced from a sheet-metal part by stamping, cutting and/or bending. The at least one signal pin is physically separated from an inner lateral surface of the shielding jacket in order to ensure potential isolation between the signal pin and the shielding jacket. A shielding jacket is assigned to each power switch which comprises a control electrode. Undesired and damaging effects such as parasitic turn-on (PTO) and the safety operating areas (SOAs) being exceeded which can be attributed to electromagnetic interference can be at least reduced with the aid of the shielding jacket according to the present disclosure.

In accordance with one embodiment, the shielding jacket is coated with a current-insulating protective cladding. The current-insulating protective cladding is preferably formed by encapsulation of the shielding jacket with a current-insulating injection-molding material. Alternatively, the current-insulating protective cladding can be a prefabricated component part which is connected to or brought into engagement with the shielding jacket. The protective cladding or protective encapsulation is used both for holding the at least one signal pin in the shielding jacket and for protecting the shielding jacket from external environmental influences such as mechanical impacts and for electrical insulation between the signal pin and the shielding jacket and between the latter and external component parts.

In accordance with one further embodiment, the signal pin protrudes out from the interior of the shielding jacket along a longitudinal direction in each case through an opening beyond two mutually opposite end sides of the current-insulating protective cladding or protective encapsulation. The openings are formed in the end sides of the current-insulating protective cladding. Therefore, the signal pin can be contact-connected in a simple manner from the outside. At the same time, a reliable hold for the at least one signal pin is provided. The at least one signal pin is preferably introduced into the current-insulating protective cladding by being pressed in or injected through the openings.

In accordance with one further embodiment, a first end section of the at least one signal pin which protrudes out beyond a first end side of the current-insulating protective cladding is connected to the control device, wherein a second end section of the at least one signal pin which is opposite the first end section and protrudes out beyond a second end side of the current-insulating protective cladding is electrically connected to the control electrode of the power switch, preferably is connected directly, in current-conducting fashion, to the control electrode. The first end section of the signal pin is preferably connected to the control device by being pressed into the printed circuit board which is populated with the electrical and electronic component parts forming the control device. The second end section of the signal pin is preferably connected to a conductor track laid on the circuit carrier, which is in the form of a printed circuit board (PCB), by soldering, sintering or adhesive bonding, wherein the conductor track is electrically connected to the control electrode of the power switch. In addition, the second end section of the signal pin is preferably bent from the longitudinal direction of the signal pin in a direction parallel to the circuit carrier (or substrate), which favors a flat and more compact design. In the case where a plurality of signal pins is held in the shielding jacket, the first end sections of the signal pins can run parallel to one another, wherein the second end sections of the signal pins can run in different directions. For example, in the case of two signal pins, the second end sections can be bent in opposite directions.

In accordance with a further embodiment, the shielding jacket has a first end contact which protrudes out beyond a first end side of the current-insulating protective cladding for connection to the control device, wherein the shielding jacket has a second end contact which protrudes out beyond a second end side of the current-insulating protective cladding which is opposite the first end side for connection to one of the two current electrodes of the power switch. The first end contact is preferably connected to the control device by being pressed into the printed circuit board. The second end contact is preferably connected to a conductor track laid on the circuit carrier, which is in the form of a printed circuit board (PCB), by soldering, sintering or adhesive bonding, wherein the conductor track is electrically connected to the negative-pole current electrode or current electrode connected to ground potential (for example source electrode) of the power switch. In this way, the shielding jacket at the same time acts as an electrical connection to ground or to the source electrode.

In accordance with a further embodiment, the power module has at least one further signal pin which is potentially isolated from and surrounds at least sections of the shielding jacket, wherein the further signal pin is designed to impress a further control signal on an auxiliary switch, for example on a clamping switch for short-circuiting the control electrode (for example gate electrode) with a current electrode connected to ground potential (for example source electrode) of the power switch. The at least one further signal pin is therefore used not for driving the power switch but for driving an auxiliary switch which is different than the power switch and does not belong to the half-bridge. The auxiliary switch is used for performing a protective and/or measurement function in the power module. Purely by way of example, the auxiliary switch can be designed for active Miller clamping (ACM auxiliary switch). The present disclosure is not restricted hereto, however. Rather, further examples of the auxiliary switch are conceivable. In this way, functionally different signal pins can be arranged in the same shielding jacket, which enables a more compact design.

The present disclosure furthermore relates to a converter having a power module according to one of the embodiments described here, a corresponding electric axle drive comprising such a converter and a vehicle having such an electric axle drive. As described above, the converter can comprise an inverter, a rectifier or a DC/DC converter, wherein the present disclosure is not restricted to these purely exemplary converter designs, but rather can be used generally in semiconductor-based power electronics. This results in the advantages already described in connection with the power module according to the present disclosure for the converter according to the present disclosure, the electric axle drive according to the present disclosure and the vehicle according to the present disclosure as well.

The present disclosure will be explained by way of example below with reference to embodiments illustrated in the figures.

DETAILED DESCRIPTION

Identical subjects, functional units and comparable components are denoted throughout the figures by the same reference signs. These subjects, functional units and comparable components are embodied identically in terms of their technical features where not specified otherwise explicitly or implicitly in the description.

Figure 1:
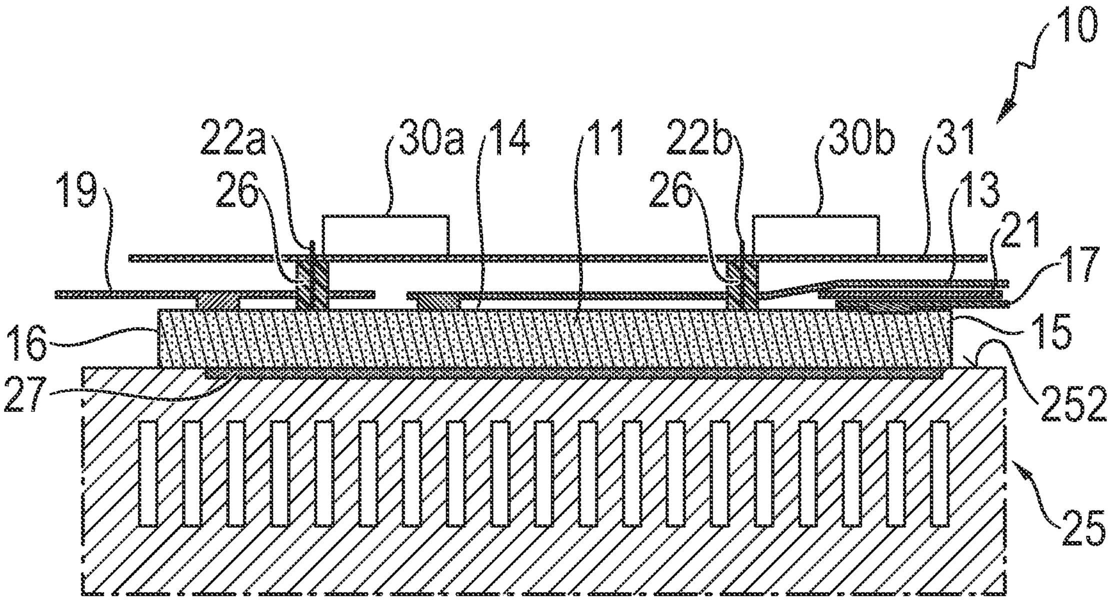
FIG. 1 shows a schematic illustration of a power module in accordance with one embodiment in a side view.

FIG. 1 shows a schematic illustration of a power module 10 in accordance with one embodiment. The power module 10 is for use in a converter (not illustrated in any more detail here) for converting an input current into an output current. The converter is in the form of, for example, an inverter. In this case, the input current is a direct current provided by a DC voltage source, for example a rechargeable vehicle drive battery, wherein the output current is an alternating current having a plurality of phase currents. Alternatively, the converter is in the form of a rectifier in order to, for example, recharge the vehicle drive battery. For this purpose, an AC input voltage which is provided by an AC voltage supply (for example charging station) is converted, via the rectifier, into a DC output voltage, which can then be supplied to the vehicle drive battery. Further alternatively, the converter is used as a DC/DC converter in order to convert a DC input voltage for adapting to the DC operating voltage (rated voltage) of the vehicle drive battery, for example in order to step it up from 400V to 800V. The power module 10 will be explained below with reference to the example of an inverter, wherein the present disclosure is not restricted hereto and can be used in all power electronics converter designs.

The power module 10 comprises a plurality of power switches 12 for feeding the input current and for generating the output current on the basis of the fed input current by switching of the power switches 12. In FIG. 1, the power switches 12 are not shown or are hidden owing to a casting compound 11. One of the power switches 12, which are in the form of MOSFETs, for example, can be seen in a schematic circuit diagram in FIG. 5. The power switches 12 are also preferably on a circuit carrier 29 (see FIG. 2) which is in the form of, for example, a printed circuit board (PCB) or multilayered ceramic substrate such as direct bonded copper (DBC), direct plated copper (DPC) or active metal bonding (AMB). Preferably, the power switches are arranged on an at least partially metallic first layer of the circuit carrier, wherein an at least partially metallic second layer of the circuit carrier is connected to a cooler. Preferably, a layer of insulation is arranged between the first layer and the second layer.

The power switches 12 form a high side and a low side of a half-bridge, wherein the high side and the low side each comprise one or more power switches 12 connected in parallel with one another. The power switches 12 each comprise a positive-pole or controlled current electrode (for example drain electrode) 18, a negative-pole current electrode or current electrode which is connected to ground potential (for example source electrode) 20 and a control electrode (for example gate electrode) 24. The electrodes 18,20,24 are shown purely by way of example in the schematic circuit diagram in FIG. 5. The positive-pole current electrode 18 and the negative-pole current electrode 20 form, together with the semiconductor structure located therebetween, a load path of the respective power switch 12 through which the load current flows in an open (conducting) state of the power switch 12. The ground potential is preferably provided by a metallic layer of the circuit carrier 29 on which the power switches 12 are arranged. The current is carried within the power electronics, in particular between the individual power switches 12, with the aid of a plurality of electrical lines which are in the form of, for example, wire bonds or are integrated in a leadframe.

For the external current-carrying, in particular for feeding the input current (load current) into the power electronics or for withdrawing the output current from the power electronics, the power module 10 comprises at least one positive-pole DC power terminal 14, at least one negative-pole DC power terminal 15 and at least one AC power terminal 16. These power terminals 14,15,16 are electrically connected on one side to the current electrodes 18,20 of the respective power switch 12 and are connected on the other side to busbars. In this case, the positive-pole DC power terminal 14 is connected, in current-conducting fashion, to a positive-pole DC busbar 13, the negative DC power terminal 15 is connected, in current-conducting fashion, to a negative-pole DC busbar 17, and the AC power terminal 16 is connected, in current-conducting fashion, to an AC busbar 19. In this way, it is possible for current to be carried with further component parts of the converter, for example a DC-link capacitor 33 (see FIG. 5), or an external unit such as the windings of the electric machine to be energized. In particular, the DC-link capacitor 33 is connectable to the DC busbars 13, 17, wherein, for the purpose of potential isolation, a layer of insulation 21 is preferably arranged between the DC busbars 13,17.

In addition, each control electrode 24 has at least one assigned signal pin 22*a,b*, to which the control electrode 24 is electrically conductively connected and by which a plurality of control signals generated by a control device (for example gate driver) 30*a,b* can be impressed on the control electrode 24 of the respective power switch 12. Therefore, the control electrode 24 forms, together with the associated signal pin 22*a,b*, a drive path of the power switch 12 through which the control signals are transmitted. As is shown schematically in FIG. 1, the high side and the low side each have an assigned signal pin 22*a,b* having an associated control device 30*a,b*. The control devices 30*a,b* are, as shown in FIG. 1, preferably fitted to a printed circuit board 31. In this case, the signal pins 22*a,b* have been pressed into the printed circuit board 31, wherein a different form of electrically conductive connection is likewise conceivable. The signal pins 22*a,b* are preferably present in the form of coaxial signal pins.

According to the present disclosure, a shielding jacket 26 which is potentially isolated from the signal pin 22*a,b* and surrounds at least sections of the respective signal pin 22*a,b* is assigned to each of the signal pins 22*a,b*. The shielding jacket 26 is used to shield the signal pin 22*a,b* located therein from electromagnetic interference which arises owing to the load current of the associated power switch 12. The shielding jacket 26 can preferably be produced from a sheet-metal part by stamping, cutting and/or bending. The respective signal pin 22*a,b* is physically separated from an inner lateral surface of the shielding jacket 26 in order to ensure potential isolation between the signal pin 22*a,b* and the likewise electrically conductive shielding jacket 26. With the aid of the shielding jacket 26 according to the present disclosure, undesired and damaging effects such as parasitic turn-on (PTO) and the safety operating areas (SOAs) being exceeded, which can be attributed to electromagnetic interference, can be at least reduced.

A cooler 25 is arranged on a side of the power switches 12 which is opposite the printed circuit board 31. The cooler 25 comprises, for example, a pin-fin structure in order to enlarge the area of action to which a cooling medium (for example water) can be applied. The cooler 25 is connected on its upper side 252, via a sintered layer 27 (or another thermally conductive connecting layer), to a lower side of the circuit carrier 29 in order to thermally couple the power switches 12 or the entire power electronics to the cooler 25 for the purpose of heat dissipation.

Figure 2:
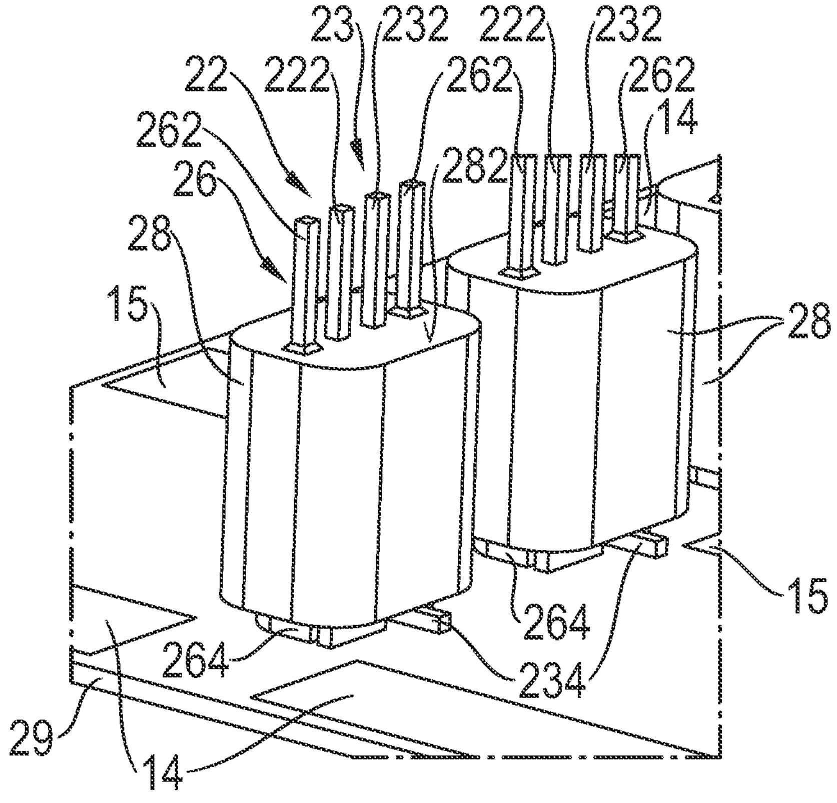
FIG. 2 shows a schematic illustration of a detail of a power module in accordance with a further embodiment in a perspective view.

FIG. 2 shows a schematic illustration of a detail of the power module 10 in accordance with a further embodiment. It can be seen here that the circuit carrier 29 is in the form of a printed circuit board or PCB on which the DC power terminals 14, 15 are fitted. In addition, the AC power terminal 16 is (or the AC power terminals 16 are) likewise also fitted on the circuit carrier 29, although this is not shown in FIG. 2. In addition, it can be seen that the signal pins 22 accommodated in the shielding jackets 26 are also arranged on the circuit carrier 29 in such a way that they are connected to the respective control electrode 24. As is shown in more detail in FIGS. 3-4, the shielding jacket 26 is coated with a current-insulating protective cladding 28, which in this case is preferably in the form of a protective encapsulation. Each signal pin 22 has a first end section 222 which protrudes out beyond a first end side 282 of the protective encapsulation 28 which is remote from the printed circuit board 29. Each signal pin 22 also has a second end section 224 which is opposite the first end section 222 and protrudes out beyond a second end side 284 of the protective encapsulation 28 which faces the printed circuit board 29. The shielding jacket 26 itself also has a first end contact 262 which protrudes out beyond the first end side 282 and a second end contact 264 which is opposite the first end contact 262 and protrudes out beyond the second end side 284. The first end section 222 of the signal pin 22 and the first end contact 262 of the shielding jacket 26 are used for connection to the control device 30 by virtue of them being introduced into the printed circuit board 31 by being pressed in, for example. The second end section 224 of the signal pin 22 and the first end contact 262 of the shielding jacket 26 are used for connection to the circuit carrier 29 by virtue of them being introduced into the circuit carrier 29, which is in the form of a printed circuit board, by being pressed in or by virtue of them being connected to the circuit carrier 29 by soldering or another electrically conductive connection method.

Figure 3:
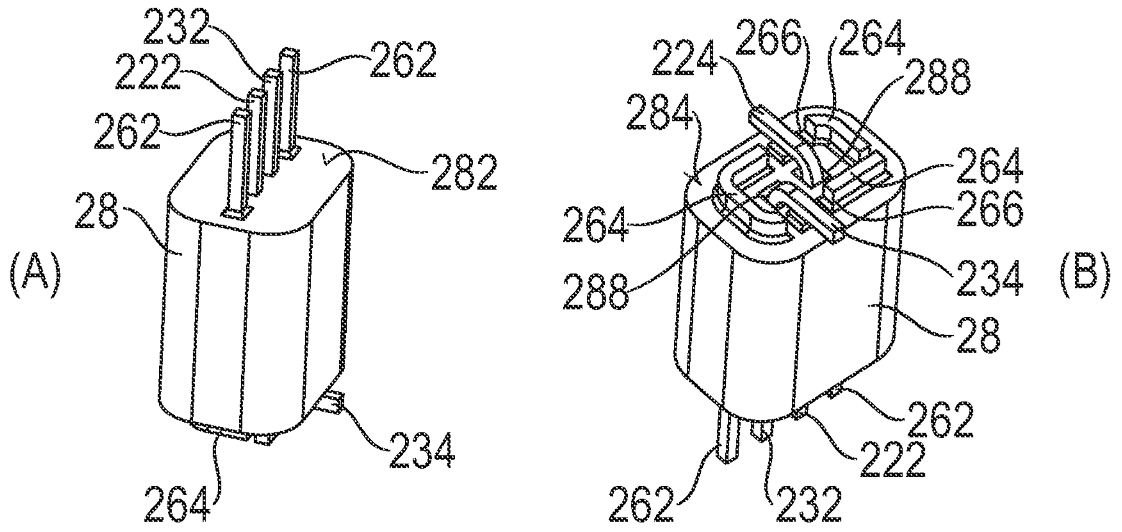
FIG. 3 shows a schematic illustration of a signal pin arrangement having two signal pins which are surrounded by a shielding jacket, wherein the shielding jacket is provided with a current-insulating protective encapsulation.
Figure 4:
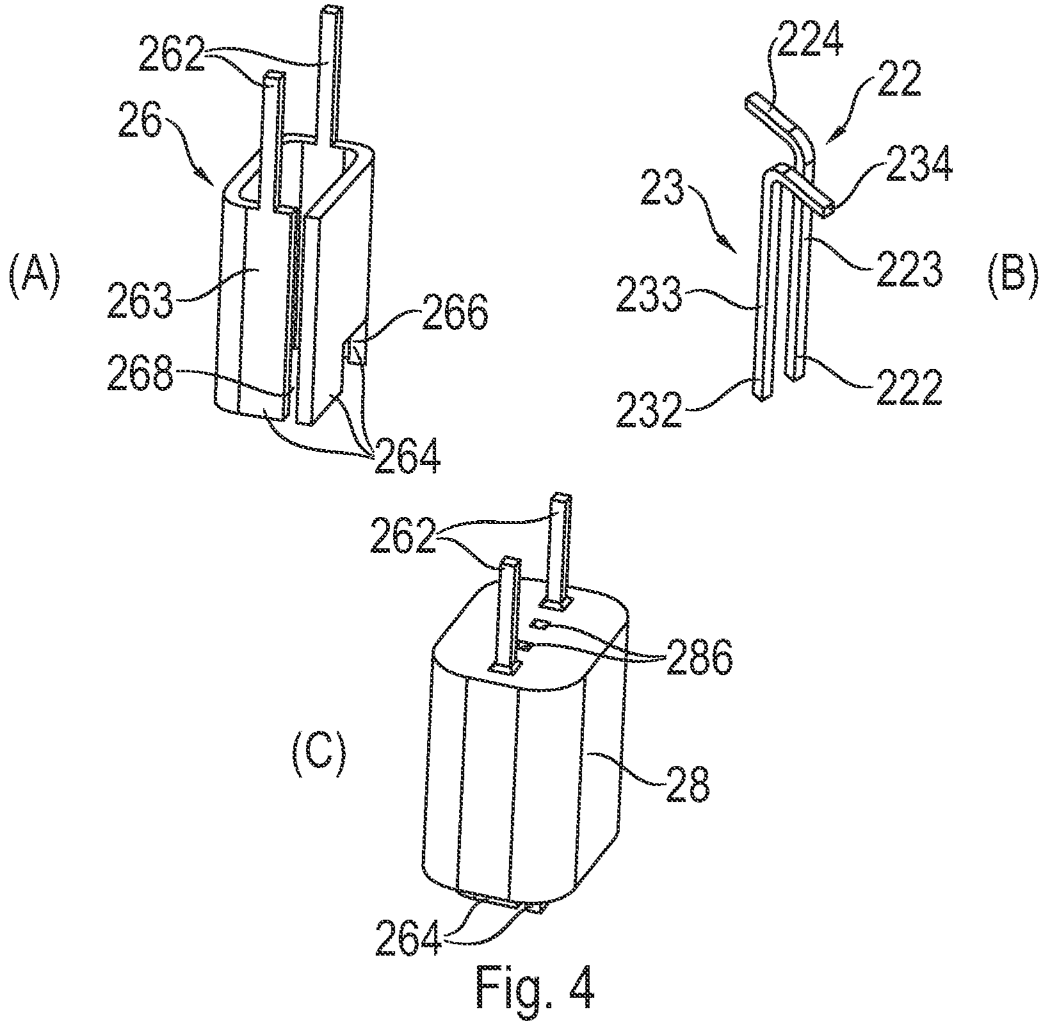
FIG. 4 shows a schematic illustration of the shielding jacket, the signal pins and the current-insulating protective encapsulation in each case in a perspective view.

It can likewise be seen in FIGS. 3-4 that a further signal pin 23, which is preferably of identical design to the signal pin 22 already described above but is not designed to drive the power switch 12 of the half-bridge but to drive an auxiliary switch 32, is surrounded in each shielding jacket 26. This will be described in more detail further below with reference to FIG. 5. As shown purely by way of example and schematically in FIGS. 3-4, both signal pins 22, 23 each have a pin shaft 223, 233 between the first end section 222, 232 and the second end section 224, 234. The second end section 224, 234 is bent from the course of the pin shaft 223, 233 and therefore from a longitudinal direction of the signal pin 22, 23. The signal pins 22, 23 are arranged in the shielding jacket 26 in such a way that the end section 224 of the signal pin 22 of the power switch 12 is bent in a different, preferably opposite direction in comparison with the end section 234 of the signal pin 23 of the auxiliary switch 32. The end sections 224, 234 extend substantially parallel to the second end side 284 of the current-insulating protective encapsulation 28. In addition, two cutouts 266 are formed in the second end contact 264 of the shielding jacket 26 through which the bent second end sections 224, 234 of the signal pins 22, 23 extend in each case.

FIG. 4 additionally illustrates the production method of the encapsulated shielding jacket 26. The shielding jacket 26 is initially preferably shaped from a single sheet-metal part, for example by stamping, cutting and/or bending of the sheet-metal part. In the process, the design shown in FIG. 4A is produced. A main jacket part 263 of the shielding jacket 26 formed in this way has a slot 268. Thereafter, the shielding jacket 26 from FIG. 4A is encapsulated by the current-insulating injection-molding material, resulting in the protective encapsulation 28. The protective encapsulation 28 has in each case at least one opening, in this case, by way of example, two openings 286, 288, in the end sides 282, 284 for passing through the signal pins 22, 23. The signal pins 22, 23 are shown by way of example in FIG. 4B.

Figure 5:
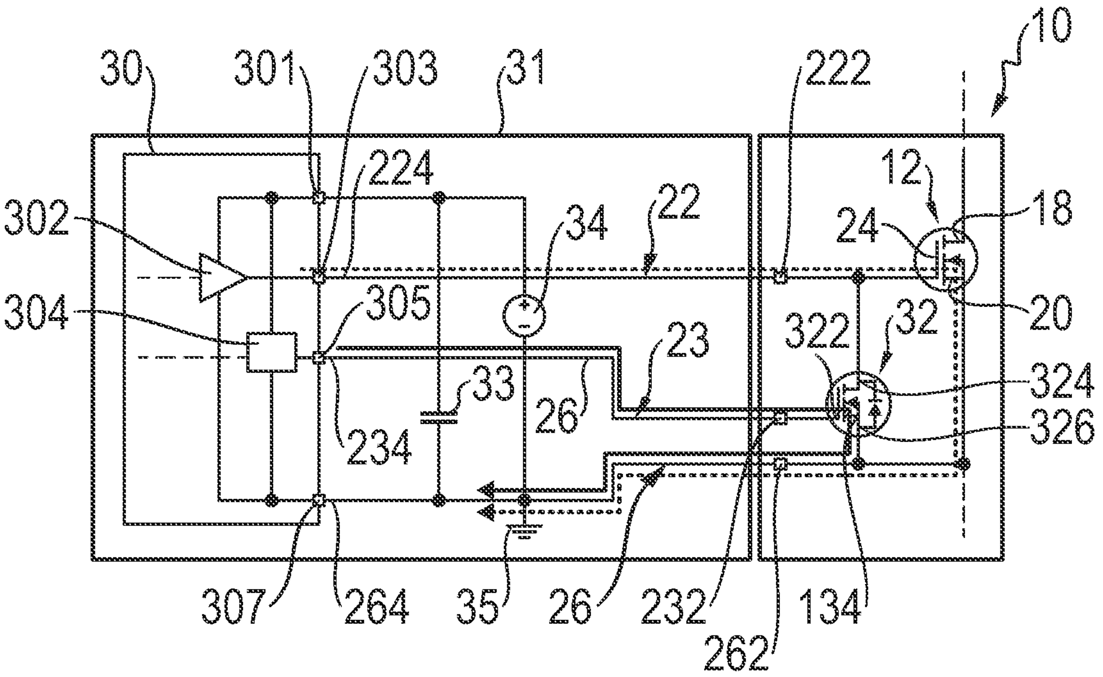
FIG. 5 shows a schematic circuit diagram of the power module in accordance with a further embodiment.

In the schematic circuit diagram in FIG. 5, the interconnection of the power switch 12, the auxiliary switch 32 (in this case, purely by way of example and in a way which is not restrictive to the present disclosure, in the form of an ACM auxiliary switch or clamping switch), the signal pins 22, 23 and the control device 30 in the power module 10 is shown purely by way of example. The ACM auxiliary switch 32 is used for short-circuiting the control electrode or gate electrode 24 with the negative-pole current electrode or current electrode connected to ground potential 20 of the power switch 12 when a predefined threshold of the load current is exceeded. The control device 30 is in this case preferably in the form of a gate driver and comprises a first driver module 302 for generating control signals (gate signals) for the power switch 12. In addition, the control device 30 or the gate driver comprises a second driver module 304 for generating control signals (gate signals) for the auxiliary switch or ACM auxiliary switch 32. Furthermore, a positive voltage supply (VDD) 34 is connected to the control device 30 via a node 301. The DC-link capacitor 33 is interconnected between a positive pole of the positive voltage supply 34 and ground 35. Although not shown in FIG. 5, the control device 30 has been fitted on the printed circuit board 31 (see FIG. 1) and can be driven from a central control unit (for example the ECU of the vehicle).

The signal pin 22 assigned to the power switch 12 is connected at its first end section 222 to the control electrode or gate electrode 24 of the power switch 12 and at its second end section 224 to the control device 30 or the first driver module 302 via a corresponding node 303. Similarly, the signal pin 23 assigned to the auxiliary switch or ACM auxiliary switch 32 is connected at its first end section 232 to a control electrode 322 of the ACM auxiliary switch 32 and at its second end section 234 to the control device 30 or the second driver module 304 via a corresponding node 305. The shielding jacket 26 is, as shown in FIG. 5, connected to ground 35 and, as a result, is connected to ground potential. In addition, the shielding jacket 26 is electrically connected at its first end contact 262 to the current electrode or source electrode 20 of the power switch 12 and to the current electrode or source electrode 326 of the ACM auxiliary switch 32. Furthermore, the shielding jacket 26 is connected at its second end contact 264, via a corresponding node 307, to the control device 30 or both to the first driver module 302 and to the second driver module 304. In this way, a first drive path of the power switch 12 is formed (indicated by dotted arrow line) which runs, beginning from the first driver module 302, via the node 303, the signal pin 22 up to the control electrode 24 of the power switch 12 and goes from there via the negative-pole current electrode 20, the shielding jacket 26 up to ground 35. Similarly, a second drive path of the ACM auxiliary switch 32 is formed (indicated by dotted arrow line) which runs, beginning from the second driver module 304, via the node 305, the signal pin 23 up to the control electrode 322 of the ACM auxiliary switch 32 and goes from there via the negative-pole current electrode 326, the shielding jacket 26 up to ground 35. The first drive path of the power switch 12 is electromagnetically decoupled from the actual load path (which runs from the positive-pole current electrode 18 via the semiconductor structure to the negative-pole current electrode 20 and then to ground 35) with the aid of the shielding jacket 26, with the result that the transmission of the control signal (gate signal) for the power switch 12 is not impaired by interference and is therefore more robust. Equally, the second drive path of the ACM auxiliary switch 32 is also electromagnetically decoupled from the actual load path (which runs from the positive-pole current electrode 324 via the semiconductor structure to the negative-pole current electrode 326 and then to ground 35) with the aid of the shielding jacket 26, with the result that the transmission of the control signal (gate signal) for the ACM auxiliary switch 32 as well has increased robustness with respect to interference. In addition, the shielding jacket 26 acts both as a shield for the signal pins 22, 23 and as a source contact for connecting the negative-pole current electrode or source electrode 20, 326 of the switches 12, 32 to ground 35. As a result, an additional electrical line for this purpose can be dispensed with, with the result that the power module 10 can be formed so as to be overall more compact.

Figure 6:
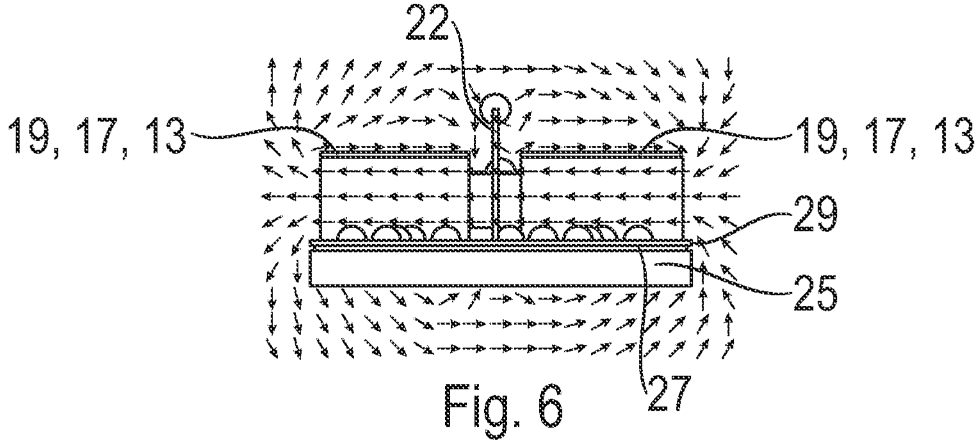
FIG. 6 shows a schematic illustration of a spatial distribution of magnetic lines of force in the power module in the case without a shielding jacket.
Figure 7:
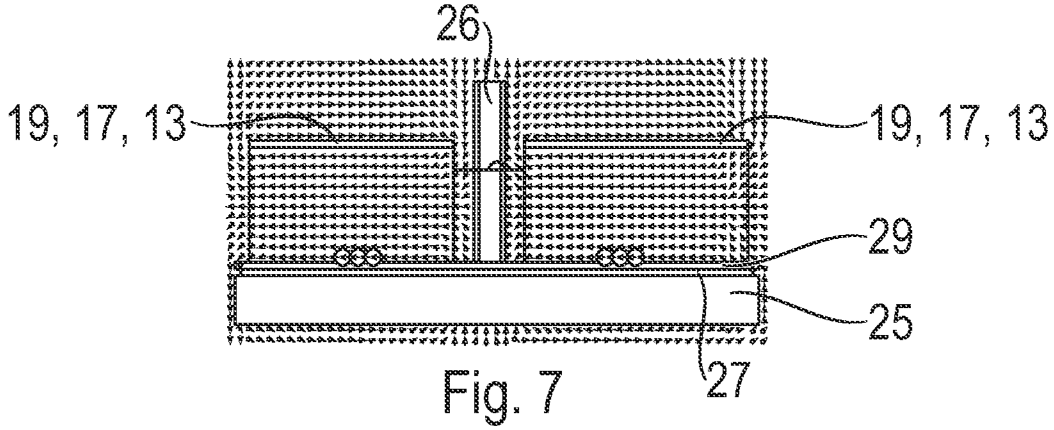
FIG. 7 shows a schematic illustration of a spatial distribution of magnetic lines of force in the power module in the case of a shielding jacket.

FIGS. 6-7 illustrate, purely schematically and by way of example, the shielding effect of the shielding jacket 26 according to the present disclosure. In the case without such a shielding jacket 26, as is shown in very simplified form in FIG. 6, the signal pin 22 is subjected directly to the magnetic lines of force (indicated by arrows) which are generated by the load path or the load current of the power switch 12 which also flows in the busbars 13,17,19 via the electrical contact-connection of the power switch 12. In the case of shielding by the shielding jacket 26, as is shown in very simplified form in FIG. 7, the magnetic lines of force run outside the shielding jacket 26, with the result that the signal pin 22 accommodated in the shielding jacket 26 is not subjected to the lines of force. In this way, decoupling of the signal pin 22 or the drive path from the load path of the power switch 12 is ensured. This correspondingly also applies to the ACM auxiliary switch 32 and any other auxiliary switch (not shown here) which can be interconnected in the power module 10.

REFERENCE NUMBERS

10 power module
11 casting compound
12 power switch
13 positive-pole DC busbar
14 positive-pole DC power terminal
15 negative-pole DC power terminal
16 AC power terminal
17 positive-pole DC busbar
18 positive-pole current electrode (drain electrode)
19 AC busbar
20 negative-pole current electrode (source electrode)
21 layer of insulation
22, 22*a*-*b*, 23 signal pin

222, 232 first end section
224, 234 second end section
223, 233 pin shaft
24 control electrode (gate electrode)
25 cooler
252 upper side
26 current-insulating shielding jacket
262 first end contact
263 main jacket part
264 second end contact
266 cutout
268 slot
27 sintered layer
28 current-insulating protective cladding (protective encapsulation)
282 first end side
284 second end side
286, 288 openings
29 circuit carrier
30, 30*a-b* control device (gate driver)
301, 303, 305, 307 node
302 first driver module
304 second driver module
31 printed circuit board
32 auxiliary switch (ACM auxiliary switch)
322 control electrode (gate electrode)
324 positive-pole current electrode (drain electrode)
326 negative-pole current electrode (source electrode)
33 DC-link capacitor
34 positive voltage supply (VDD)
35 ground

The invention claimed is:

1. A power module for a converter for use in an at least partly electrified vehicle, the power module comprising:
- at least one power switch configured to be switched for converting an input current into an output current;
- a plurality of power terminals electrically connected to current electrodes of the at least one power switch and configured to feed the input current or to withdraw the output current;
- a signal pin configured to impress a control signal generated by a control device on a control electrode of the power switch; and
- a shielding jacket which is potentially isolated from the signal pin and surrounds at least sections of the signal pin,
- wherein the shielding jacket is produced from a sheet-metal part by at least one of stamping, cutting, and/or bending.

2. The power module as claimed in claim 1, comprising:
- a current-insulating protective cladding coating the shielding jacket, wherein the current-insulating protective cladding is formed by encapsulation of the shielding jacket with a current-insulating injection-molding material.

3. The power module as claimed in claim 2, wherein the signal pin protrudes out from an interior of the shielding jacket along a longitudinal direction through openings formed on two mutually opposite end sides of the current-insulating protective cladding beyond the end sides.

4. The power module as claimed in claim 3, wherein a first end section of the signal pin is connected to the control device, wherein a second end section of the signal pin which is opposite the first end section is electrically connected directly in current-conducting fashion to the control electrode of the power switch.

5. The power module as claimed in claim 2, wherein the shielding jacket has a first end contact which protrudes out beyond a first end side of the current-insulating protective cladding for connection to the control device, wherein the shielding jacket has a second end contact which protrudes out beyond a second end side of the current-insulating protective cladding which is opposite the first end side for connection to one of the current electrodes of the power switch.

6. The power module as claimed in claim 2, comprising:
- at least one further signal pin which is potentially isolated from and surrounds at least sections of the shielding jacket, wherein the further signal pin is configured to impress a further control signal on an auxiliary switch.

7. The power module as claimed in claim 6, wherein the auxiliary switch is a clamping switch for short-circuiting the control electrode with a current electrode of the current electrodes that is connected to ground potential.

8. A converter for use in an at least partly electrified vehicle, comprising one or more of the power modules as claimed in claim 1.

9. An electric axle drive for an at least partly electrified vehicle, comprising:
- an electric machine;
- a gear device; and
- the converter as claimed in claim 8.

10. An at least partly electrified vehicle, comprising the electric axle drive as claimed in claim 9.

11. A power module for a converter for use in an at least partly electrified vehicle, the power module comprising:
- at least one power switch configured to be switched for converting an input current into an output current;
- a plurality of power terminals electrically connected to current electrodes of the at least one power switch and configured to feed the input current or to withdraw the output current;
- a signal pin configured to impress a control signal generated by a control device on a control electrode of the power switch;
- a shielding jacket which is potentially isolated from the signal pin and surrounds at least sections of the signal pin; and
- a current-insulating protective cladding coating the shielding jacket, wherein the current-insulating protective cladding is formed by encapsulation of the shielding jacket with a current-insulating injection-molding material.

12. The power module as claimed in claim 11, wherein the shielding jacket is produced from a sheet-metal part by at least one of stamping, cutting, and/or bending.

13. The power module as claimed in claim 11, wherein the signal pin protrudes out from an interior of the shielding jacket along a longitudinal direction through openings formed on two mutually opposite end sides of the current-insulating protective cladding beyond the end sides.

14. The power module as claimed in claim 13, wherein a first end section of the signal pin is connected to the control device, wherein a second end section of the signal pin which is opposite the first end section is electrically connected directly in current-conducting fashion to the control electrode of the power switch.

15. The power module as claimed in claim 11, wherein the shielding jacket has a first end contact which protrudes out beyond a first end side of the current-insulating protective cladding for connection to the control device, wherein the shielding jacket has a second end contact which protrudes out beyond a second end side of the current-insulating protective cladding which is opposite the first end side for connection to one of the current electrodes of the power switch.

16. The power module as claimed in claim 11, comprising:

at least one further signal pin which is potentially isolated from and surrounds at least sections of the shielding jacket, wherein the further signal pin is configured to impress a further control signal on an auxiliary switch.

17. The power module as claimed in claim 16, wherein the auxiliary switch is a clamping switch for short-circuiting the control electrode with a current electrode of the current electrodes that is connected to ground potential.

18. A converter for use in an at least partly electrified vehicle, comprising one or more of the power modules as claimed in claim 11.

19. An electric axle drive for an at least partly electrified vehicle, comprising:

an electric machine;

a gear device; and the converter as claimed in claim 18.

20. An at least partly electrified vehicle, comprising the electric axle drive as claimed in claim 19.

* * * * *